(12) United States Patent
Alabin et al.

(10) Patent No.: US 8,274,145 B2
(45) Date of Patent: Sep. 25, 2012

(54) SEMICONDUCTOR PACKAGE SYSTEM WITH PATTERNED MASK OVER THERMAL RELIEF

(75) Inventors: Leocadio M. Alabin, Singapore (SG); Librado Gatbonton, Singapore (SG); Chiu Hsieh Ong, Singapore (SG); Beng Yee Teh, Singapore (SG); Antonio B. Dimaano, Jr., Singapore (SG)

(73) Assignee: Stats Chippac Ltd., Singapore (SG)

( * ) Notice: Subject to any disclaimer, the term of this patent is extended or adjusted under 35 U.S.C. 154(b) by 496 days.

(21) Appl. No.: 11/773,951

(22) Filed: Jul. 5, 2007

(65) Prior Publication Data

US 2009/0008768 A1    Jan. 8, 2009

(51) Int. Cl.
*H01L 23/48* (2006.01)

(52) U.S. Cl. .............. 257/693; 257/782; 257/E21.061; 438/121

(58) Field of Classification Search .............. 257/783, 257/E21.061, 499, 666–782; 438/121
See application file for complete search history.

(56) References Cited

U.S. PATENT DOCUMENTS

| | | | |
|---|---|---|---|
| 5,525,204 A * | 6/1996 | Shurboff et al. | 205/125 |
| 5,740,010 A | 4/1998 | Devoe et al. | |
| 6,048,755 A | 4/2000 | Jiang et al. | |
| 6,566,762 B1 * | 5/2003 | Baker et al. | 257/778 |
| 6,569,712 B2 * | 5/2003 | Ho et al. | 438/121 |
| 6,825,569 B2 | 11/2004 | Jiang et al. | |
| 6,946,744 B2 * | 9/2005 | Maxwell et al. | 257/782 |
| 2009/0224397 A1 * | 9/2009 | Fan | 257/700 |

* cited by examiner

*Primary Examiner* — Jerome Jackson, Jr.
*Assistant Examiner* — Fang-Xing Jiang
(74) *Attorney, Agent, or Firm* — Ishimaru & Associates LLP; Mikio Ishimaru; Stanley M. Chang

(57) ABSTRACT

A semiconductor package system including: providing a substrate having a thermal relief thereon; depositing a mask on the substrate and the thermal relief, the mask deposited on the thermal relief and having a regular pattern to partially cover the thermal relief; and die attaching a semiconductor die over the thermal relief.

20 Claims, 2 Drawing Sheets

SEMICONDUCTOR PACKAGE SYSTEM WITH PATTERNED MASK OVER THERMAL RELIEF

TECHNICAL FIELD

The present invention relates generally to semiconductor package systems, and more particularly to a system having thermal relief on a package substrate.

BACKGROUND ART

Most of today's most popular electronic devices are shrinking in size while multiplying in features and functions. Devices like handheld computers, personal audio/video players, cell phones with built-in video recorders, or personal global positioning systems are stressing semiconductor packaging capabilities as they are known today. The semiconductor placed in the semiconductor package more and more transistors with each transistor generating increasing amounts of heat.

Generally, a semiconductor package system includes a substrate, a semiconductor die adhesively mounted on a planar die attach area on the substrate, and an encapsulating resin that encapsulates the semiconductor die.

Opposite the planar die attach area is an opposing conductor surface in which conductors are formed in a specific pattern to allow electrical interconnections, such as by solder balls in a ball grid array (BGA) package, to a printed circuit board.

In view of the increasing heat build-up problem and the every increasing competitive pressures, along with growing customer expectations and diminishing opportunities for meaningful product differentiation in the marketplace, it is critical that answers be found that allow more reliable semiconductor package systems.

Additionally, the need to save costs, improve efficiencies and performance, and meet competitive pressures, adds even greater urgency to the critical necessity of finding answers to the thermal performance problems.

Solutions to these problems have been long sought but prior developments have not taught or suggested any solutions and, thus, solutions to these problems have long eluded those skilled in the art.

DISCLOSURE OF THE INVENTION

The present invention provides a semiconductor package system including: providing a substrate having a thermal relief thereon; depositing a mask on the substrate and the thermal relief, the mask deposited on the thermal relief and having a regular pattern to partially cover the thermal relief; and die attaching a semiconductor die over the thermal relief.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

For expository purposes, the term "horizontal" as used herein is defined as a plane parallel to the plane or surface of the semiconductor die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements. The term "system" means the method and the apparatus of the present invention as will be apparent from context. The term "processing" as used herein includes stamping, forging, patterning, exposure, development, etching, cleaning, and/or removal of material or laser trimming as required in forming a described structure.

Figure 1:
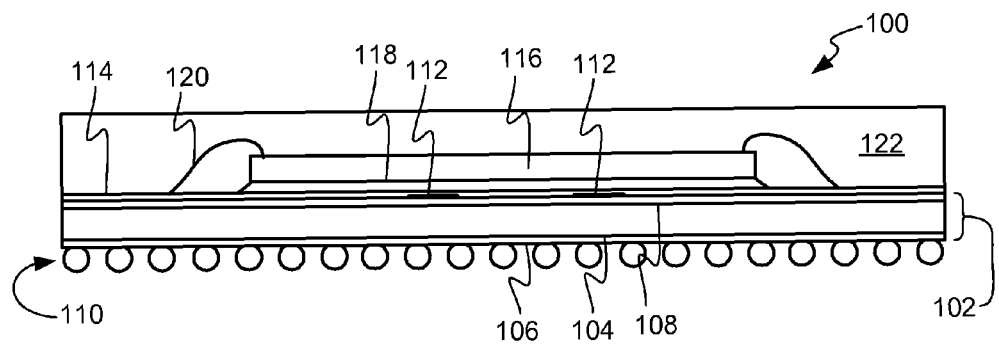
FIG. 1 is a cross-sectional view of a semiconductor package system in accordance with an embodiment of the present invention.

Referring now to FIG. 1, therein is shown a cross-sectional view of a semiconductor package system 100 in accordance with an embodiment of the present invention.

The semiconductor package system 100 includes a substrate 102 comprised of a core 104, a lower resin layer 106, and an upper resin layer 108. The core 104 is made from resin cloth, such as glass cloth, poly(p-)phenylele terephtalamide (PPTA) fiber, and liquid crystal polymers, nonwoven cloth (such as aramid and aromatic polyester) and porous sheets such as fluorine resin, impregnated with thermosetting or thermoplastic resin. The lower resin layer 106 and the upper resin layer 108 are made up of multiple layers of thermosetting or thermoplastic resins. The material can be selected from bismaleimide-triazine resin (BT resin), epoxy resin, phenol resin, vinyl benzyl resin, polyphenylene ether (polyphenylene ether oxide) resin (PPE, PPO), cyanate resin, benzoxazine resin, polyimide resin, aromatic polyester resin, polyphenylene sulfide resin, polyether imide resin, polyallylate resin, polyetheretherketone resin, etc. All these resins can be combined with fillers.

On the bottom side of the substrate 102 is conductor surface in which conductors are formed in a specific pattern to allow electrical interconnections 110, such as by solder balls in a ball grid array (BGA) package, to be formed for connection to a printed circuit board (not shown).

Figure 2:
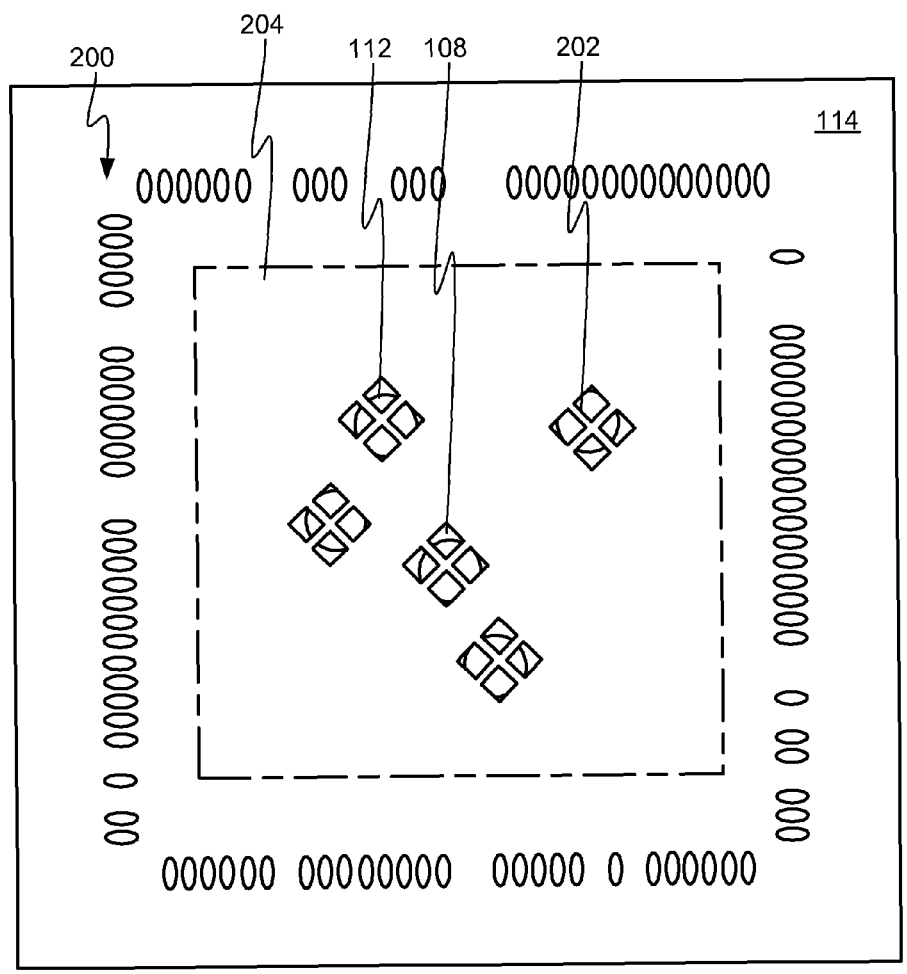
FIG. 2 is a plan view of the substrate and thermal relief pads with a patterned solder mask in the structure of FIG. 1.

The electrical interconnections 110 are connected by vias (not shown) to bond pads 200 shown in FIG. 2 on the topside of the substrate 102. A cover layer or mask in the form of a patterned solder mask 114 is deposited on the upper resin layer 108.

A semiconductor die 116 is bonded by a die attach adhesive 118 on top of the patterned solder mask 114. Bond wires 120 connect the semiconductor die 116 to the bond pads 200 and by the vias through the substrate 102 to the electrical interconnections 110. The semiconductor die 116 and the bond wires 120 are encapsulated in an encapsulant 122, such as an epoxy resin.

Thermal relief is provided in the form of thermal relief pads 112 formed between the topside of the substrate 102 and the patterned solder mask 114. The thermal relief pads 112, generally made from a conductive metal such as gold, are used to improve the thermal performance of the semiconductor package system 100. The heat dissipation path is about 80 percent beneath the semiconductor die 116, which is the reason why the thermal relief pads 112 play an important role in heat management. The thermal relief pads 112 are directly under and within planar extents of the semiconductor die 116 with the planar extents bounded by vertical planes at a perimeter of the semiconductor die 116. A pattern of holes of the patterned solder mask 114 exposes a portion of the upper resin layer 108 of the substrate 102 and portions of the thermal relief pads 112 formed on the top surface of the upper resin layer 108. The die attach adhesive 118 is applied vertically through and within the pattern of the holes to contact or attach the semiconductor die 116 and the portion of the upper resin layer 108 and the portions of the thermal relief pads 112. A portion of the die attach adhesive 118 from the holes of the patterned solder mask 114 can be applied directly vertical to the substrate 102. The semiconductor die 116 can be mounted over the thermal relief pads 112.

A number of problems have been found with the use of completely exposed thermal relief pads. One problem is that the bonding between the die attach adhesive 118 and the metal of the thermal relief pad 112 is poor, and this causes delamination of the die attach adhesive 118 from the thermal relief pad 112.

The delamination of the die attach adhesive 118 from the thermal relief pad 112 often causes cracking of the encapsulant 122 and failure of the semiconductor package system 100.

Referring now to FIG. 2, therein is shown a plan view of the substrate 102 and the thermal relief pads 112 with the patterned solder mask 114 in the structure of FIG. 1. The solder mask 114 is patterned to leave the bonding pads 200 exposed for wire bonding of the bond wires 120 (shown in FIG. 1). For reference, a semiconductor die attach area 204 is shown, which indicates the area covered by the die attach adhesive 118.

The solder mask 114 is generally a photoimageable material that can be blanket deposited as a wet or dry film, exposed through a mask, developed, and then cured. Wet films are preferred because of their moisture resistance and low cost.

The solder mask 114 has a smooth surface and a low surface tension, which sometimes allows air to be entrapped around the perimeter of the thermal relief pads 112 because the die attach adhesive 118 does not flow smoothly into these areas. This can also lead to delamination between the die attach adhesive 118 and the thermal relief pads 112, which also leads to cracking of encapsulant 122 and failure of the semiconductor package system 100. the solder mask 14 can include a pattern of holes 202. The substrate 102 and only one of the thermal relief pads 112 can be partially exposed from one of the holes 202.

It has been discovered that when the solder mask 114 is exposed and processed in a pattern of the holes 202 that partially covers the thermal relief pads 112 and exposes portions thereof that the delamination problems can be solved.

The die attach adhesive 118 (shown in FIG. 1) bonds better to the solder mask 114 than to the thermal relief pads 112 so as to eliminate air entrapment and reduce the area of the thermal relief pads 112.

It has been discovered that the pattern of the holes 202 is characterized by being a mesh, or a regular pattern, having regularly spaced nodes. In FIG. 2, the solder mask 114 is patterned and processed into a row and column of squares pattern at approximately 45 degrees to the edge of the substrate 102. The thermal relief pads 112 are crossed by the solder mask 114 so as to allow the die attach adhesive 118 to bond to solder mask areas that are directly over the thermal relief pads 112. The pattern of the holes 202 are placed so as to allow access to the substrate 102 by exposing portions and forming a perimeter to portions of the substrate 102, such as upper resin layer 108 not covered by the thermal relief pads 112, to which the die attach adhesive 118 bonds better than to the metal of the thermal relief pads 112. The pattern of the holes 202 is shown as foamed over the thermal relief Dads 112, which are arranged in an irregular pattern. The thermal relief pads 112 and the pattern of the holes 202 are shown to be in an alignment that exposes the substrate 102 through the pattern of the holes 202.

Figure 3:
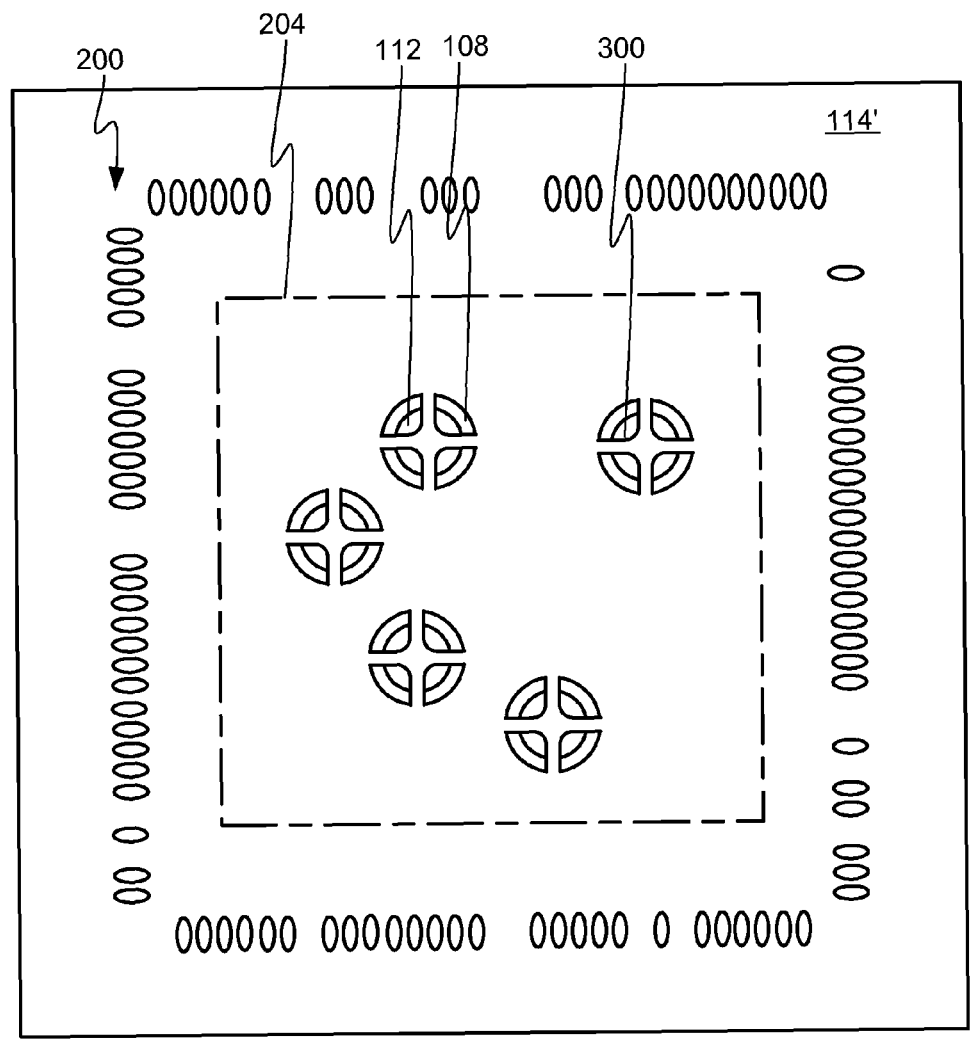
FIG. 3 is a plan view of a substrate and thermal relief pads with a patterned solder mask in an alternate embodiment of the present invention.

Referring now to FIG. 3, therein is shown a plan view of the substrate 102 and thermal relief pads 112 with a patterned solder mask 114' in an alternate embodiment of the present invention. The solder mask 114' is patterned to leave the bonding pads 200 exposed for wire bonding of the bond wires 120.

It has been discovered that another pattern of holes 300 is characterized by being a regular pattern specifically placed over the thermal relief pads 112. In FIG. 3, the solder mask 114 is patterned and processed into a pattern referred to as a cross-hair pattern 300, which depicts two intersecting patterns centered directly over each of the thermal relief pads 112. The thermal relief pads 112 are crossed by the solder mask 114 so as to allow the die attach adhesive 118 to bond to solder mask areas that are directly centered over the thermal relief pads 112. The open areas of the cross hair pattern 300 are substantially evenly around and larger than the thermal relief pads 112 so as to allow access for the die attach adhesive 118 to the substrate 102 substantially evenly around the thermal relief pads 112. The die attach adhesive 118 flows more evenly into the area around the thermal relief pads 112 to avoid air pockets and bonds well to the open areas of the substrate 102.

Figure 4:
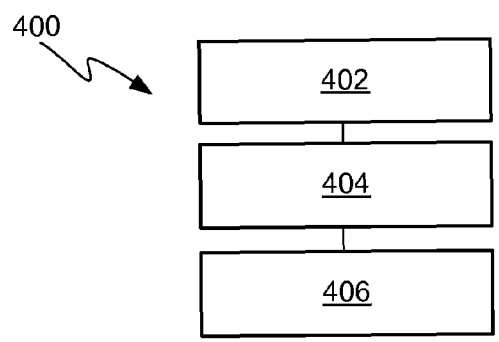
FIG. 4 is a flow chart of a semiconductor package system for manufacturing the semiconductor package system in accordance with an embodiment of the present invention.

Referring now to FIG. 4, therein is shown a flow chart of a semiconductor package system 400 for manufacturing the semiconductor package system 100 in accordance with an embodiment of the present invention. The semiconductor package system 400 includes providing a substrate having a thermal relief thereon in a block 402, depositing a mask on the substrate and the thermal relief, the mask deposited on the thermal relief and having a regular pattern to partially cover the thermal relief in a block 404, and die attaching a semiconductor die over the thermal relief in a block 406.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a semiconductor package system comprising:
   providing a substrate having thermal relief pads thereon;
   depositing a mask on the substrate and the thermal relief pads;
   processing the mask with a pattern of holes, the substrate and only one of the thermal relief pads partially exposed from one of the holes; and
   mounting a semiconductor die over the thermal relief pads, the thermal relief pads directly under and within planar extents of the semiconductor die.

2. The method as claimed in claim 1 wherein processing the mask exposes the thermal relief pads in a mesh pattern.

3. The method as claimed in claim 1 wherein processing the mask exposes the thermal relief pads in a row and column of squares pattern.

4. The method as claims in claim 1 wherein processing the mask exposes the thermal relief pads in a cross hair pattern.

5. The method as claimed in claim 1 wherein processing the mask exposes the thermal relief pads in a pattern exposing the substrate substantially evenly around the thermal relief pads.

6. A method for manufacturing a semiconductor package system comprising:
   providing a substrate having thermal relief pads thereon;
   depositing a solder mask on the substrate and the thermal relief pads;
   processing the solder mask with a pattern of holes, the substrate and only one of the thermal relief pads partially exposed from one of the holes; and
   mounting a semiconductor die over the thermal relief pads, the thermal relief pads directly under and within planar extents of the semiconductor die.

7. The method as claimed in claim 6 wherein processing the solder mask exposes the thermal relief pads in a mesh pattern exposing a portion of the thermal relief pads and the substrate.

8. The method as claimed in claim 6 wherein processing the solder mask exposes the thermal relief pads in a row and column of squares pattern at an angle to an edge of the substrate.

9. The method as claims in claim 6 wherein processing the solder mask exposes the thermal relief pads in a cross hair pattern centered on the thermal relief pads.

10. The method as claimed in claim 6 wherein processing the solder mask exposes the thermal relief pads in a pattern exposing the substrate substantially evenly around the thermal relief pads with the solder mask crossing the center of the thermal relief pads.

11. A semiconductor package system comprising:
    a substrate having thermal relief pads thereon;
    a mask on the substrate and the thermal relief pads, the mask having a pattern of holes, the substrate and only one of the thermal relief pads partially exposed from one of the holes; and
    a semiconductor die over the thermal relief pads, the thermal relief pads directly under and within planar extents of the semiconductor die.

12. The system as claimed in claim 11 wherein the mask exposes the thermal relief pads in a mesh pattern.

13. The system as claimed in claim 11 wherein processing the mask exposes the thermal relief pads in a row and column of squares pattern.

14. The system as claims in claim 11 wherein the mask exposes the thermal relief pads in a cross hair pattern.

15. The system as claimed in claim 11 wherein the mask exposes the thermal relief pads in a pattern exposing the substrate substantially evenly around the thermal relief pads.

16. The system as claimed in claim 11 wherein:
    the mask is a solder mask.

17. The system as claimed in claim 16 wherein the solder mask exposes the thermal relief pads in a mesh pattern exposing a portion of the thermal relief pads and the substrate.

18. The system as claimed in claim 16 wherein the solder mask exposes the thermal relief pads in a row and column of squares pattern at an angle to an edge of the substrate.

19. The system as claims in claim 16 wherein the solder mask exposes the thermal relief pads in a cross hair pattern centered on the thermal relief pads.

20. The system as claimed in claim 16 wherein the solder mask exposes the thermal relief pads in a pattern exposing the substrate substantially evenly around the thermal relief pads with the solder mask crossing the center of the thermal relief pads.

* * * * *

UNITED STATES PATENT AND TRADEMARK OFFICE
CERTIFICATE OF CORRECTION

PATENT NO. : 8,274,145 B2
APPLICATION NO. : 11/773951
DATED : September 25, 2012
INVENTOR(S) : Alabin et al.

It is certified that error appears in the above-identified patent and that said Letters Patent is hereby corrected as shown below:

In the Specification:

Column 3, line 2, delete "118 on top of" and insert therefor --118 on a top of--

Column 3, line 60, delete "the solder mask 14 can" and insert therefor --The solder mask 114 can--

Column 3, line 65, delete "processed in a pattern of the" and insert therefor --processed in the pattern of the--

Column 4, line 20, delete "is shown as foamed over the thermal relief Dads" and insert therefor --shown as formed over the thermal relief pads--

Signed and Sealed this
Eleventh Day of March, 2014

Michelle K. Lee
*Deputy Director of the United States Patent and Trademark Office*